(12) United States Patent
Gardner et al.

(10) Patent No.: US 6,188,106 B1
(45) Date of Patent: Feb. 13, 2001

(54) MOSFET HAVING A HIGHLY DOPED CHANNEL LINER AND A DOPANT SEAL TO PROVIDE ENHANCED DEVICE PROPERTIES

(75) Inventors: Mark I. Gardner, Cedar Creek; H. Jim Fulford, Jr.; Charles E. May, both of Austin, all of TX (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/146,410

(22) Filed: Sep. 3, 1998

(51) Int. Cl.$^7$ ............... H01L 29/78; H01L 33/00
(52) U.S. Cl. ............................................. 257/339
(58) Field of Search ................................. 257/339

(56) References Cited

U.S. PATENT DOCUMENTS

| | | |
|---|---|---|
| 5,045,898 | 9/1991 | Chen et al. . |
| 5,141,882 | 8/1992 | Komori et al. . |
| 5,283,200 | 2/1994 | Okamoto . |
| 5,362,981 | 11/1994 | Sato et al. . |
| 5,804,497 | 9/1998 | Gardner et al. . |
| 5,910,672 | * 6/1999 | Iwamatsu et al. . |
| 5,911,103 | * 6/1999 | Yamashita et al. . |
| 6,060,369 | * 5/2000 | Gardner et al. . |

FOREIGN PATENT DOCUMENTS

0357346A2   3/1990   (EP) .

OTHER PUBLICATIONS

Patent Abstracts of Japan, vol. 016, No. 279 (E–1220), Jun. 22, 1992 & JP 04 068564 A (Sony corp.), Mar. 4, 1992.
Patent Abstracts of Japan, vol. 018, No. 266 (E–1551), May 20, 1994 & JP 06 045434 A (NEC Corp.), Feb. 18, 1994.
Muller et al, Device Electronics for ICS, p. 463, 1986.*

* cited by examiner

*Primary Examiner*—Stephen D. Meier
(74) *Attorney, Agent, or Firm*—Kevin L. Daffer; Conley, Rose & Tayon

(57) ABSTRACT

A fabrication process and integrated circuit are provided in which a transistor having increased resistance to punch-through and decreased channel capacitance is formed. A liner layer is formed within the active region of a transistor to minimize punchthrough. A barrier layer is then formed between the liner layer and the upper surface of the semiconductor substrate. The barrier layer preferably inhibits migration of the liner ions into the junction and channel regions of the transistors during subsequent processing steps. Such migration could deleteriously affect transistor function by, e.g., increasing the threshold voltage and thus decreasing the drive current. The barrier layer also preferably facilitates formation of shallow junctions. In an embodiment, the liner layer may include p-type ions such as boron and the barrier layer may include nitrogen implanted into the semiconductor substrate. Alternatively, the barrier layer may include nitrogen-incorporated epitaxially grown silicon.

16 Claims, 5 Drawing Sheets

MOSFET HAVING A HIGHLY DOPED CHANNEL LINER AND A DOPANT SEAL TO PROVIDE ENHANCED DEVICE PROPERTIES

BACKGROUND OF THE INVENTION

1. Field of the Invention

This invention relates to integrated circuit fabrication and, more particularly, to a transistor having formed in the active area a highly doped liner layer to decrease channel capacitance and prevent punchthrough and a barrier layer to prevent diffusion of the liner layer into the channel and the junction areas.

2. Description of the Related Art

Fabrication of a MOSFET device is well known. Generally speaking, MOSFETs are manufactured by placing undoped polycrystalline silicon ("polysilicon") over a relatively thin gate oxide. The polysilicon material is then patterned to form a gate conductor directly above a channel region of the substrate. A dopant species is implanted into the gate conductor and regions of the substrate exclusive of the channel region, thereby forming source and drain regions adjacent to and on opposite sides of the channel region. If the dopant species used for forming the source and drain regions is n-type, then the resulting MOSFET is an NMOSFET ("n-channel") transistor device. Conversely, if the dopant species is p-type, then the resulting MOSFET is a PMOSFET ("p-channel") transistor device. Integrated circuits may utilize either n-channel devices exclusively, p-channel devices exclusively, or a combination of both on a single substrate. While both types of devices may be formed, the devices are distinguishable based on the dopant species used.

Because of the increased desire to build faster and more complex integrated circuits, it has become necessary to reduce the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length, L. However, after implantation and subsequent diffusion of the junctions, the electrical distance between junctions becomes less than the physical channel length and is often referred to as the effective channel length, $L_{eff}$. In VLSI designs, as the physical channel length decreases, so too must $L_{eff}$. Decreasing $L_{eff}$ reduces the distance between the depletion regions associated with the source and drain of a transistor. As a result, less gate charge is required to invert the channel of a transistor having a short $L_{eff}$. Accordingly, reducing L, and hence $L_{eff}$, may lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies). Minimizing L also improves the speed of integrated circuits including a large number of individual transistors because the larger drain current associated with a short channel length can drive the adjoining transistors into saturation more quickly. Also, the smaller L has less parasitic capacitance. Minimizing L is, therefore, desirable from a device operation standpoint.

In addition, minimizing L is desirable from a manufacturing perspective because a smaller area of silicon is required to manufacture a transistor having a smaller length. By minimizing the area required for a given transistor, the number of transistors available for a given area of silicon increases, with a corresponding increase in the circuit complexity that can be achieved on the given area of silicon. As layout densities increase, however, the problems associated with fabrication of transistors are exacerbated. Although n-channel devices are particularly sensitive to so-called short-channel effects ("SCE"), SCE also becomes a predominant problem in p-channel devices whenever $L_{eff}$ drops below approximately 0.8 μm.

While in operation, transistors that have heavily doped source and drain regions arranged laterally adjacent the gate conductor often experience a problem known as punchthrough, which can lead to an undesirable increase in the subthreshold current, $I_{Dst}$. Punchthrough occurs when the reverse-bias voltage on the drain is increased, leading to a widening of the drain depletion region. The drain may eventually merge into the source region, thereby reducing the potential energy barrier of the source-to-body junction. As a result, more majority carriers in the source region will have sufficient energy to overcome the barrier, causing an increased source-to-body current flow. Collection of some of this current by the drain leads to an increase in $I_{Dst}$.

To prevent short-channel MOSFETS from entering punchthrough, the substrate doping may be increased to increase the depletion-layer widths. For many long-channel devices, a single implant may serve as both a punchthrough stop and a $V_T$ adjust. In cases where a single implant is inadequate, such as in submicron MOSFETs, a second, deeper implant may be provided. The punchthrough stopper may be implanted such that its peak concentration is located at a depth near the bottom of the source and drain regions. This additional doping advantageously reduces the lateral widening of the drain depletion region below the substrate surface. Formation of a punchthrough stopper, however, requires close control of the implant placement and dose within the channel region. In addition, it is important that the punchthrough implant be kept from spreading during subsequent annealing of the substrate.

It would therefore be desirable to fabricate a submicron transistor having a punchthrough implant that is prevented from encroaching upon the channel and junction regions of the active area during subsequent thermal processing of the semiconductor substrate.

SUMMARY OF THE INVENTION

The problems outlined above are in large part solved by the technique hereof for forming a transistor having increased resistance to punchthrough and decreased channel capacitance. In one embodiment, isolation structures are formed within isolation regions of a semiconductor substrate. The isolation regions preferably include silicon dioxide and may be formed using, for example, the well-known trench isolation method or local oxidation of silicon ("LOCOS").

Following formation of the isolation structures, a liner layer may be formed in the active region of the semiconductor substrate by implanting a high concentration of dopant ions into the substrate. Preferably, the implant energy is sufficient to implant the liner layer to a depth below a depth at which lightly doped drain and source/drain impurity areas may subsequently be formed. Preferably, the liner implant is of a conductivity type opposite the conductivity type of the device to be formed. For example, in an NMOS embodiment, the liner implant ions may include p-type species, and in a PMOS embodiment, the liner implant ions may include n-type species.

Using an NMOS device as an example, boron ions may be implanted into the semiconductor substrate at an energy between about 100 keV and about 500 keV and a concentration between about $5\times10^{14}$ cm$^{-2}$ and about $8\times10^{15}$ cm$^{-2}$. By way of comparison, conventionally formed punch-through stop implants may be performed at a concentration of about $10^{11}$ to $10^{12}$ cm$^{-2}$. The resulting liner layer is preferably formed at a depth of between about 300 angstroms and about 2000 angstroms beneath the surface of the semiconductor substrate. Alternatively, other sources for p-type ions, such as boron difluoride, may be used to form the liner layer.

Following formation of the liner layer, a sacrificial layer may be formed upon the upper surface of the semiconductor substrate. Preferably, the semiconductor substrate includes single crystal silicon and the sacrificial layer includes silicon dioxide thermally grown upon the upper surface of the semiconductor substrate to a thickness of between about 100 angstroms and about 300 angstroms.

A barrier layer may then be formed by implanting barrier ions into the semiconductor substrate at a depth less than the depth of the liner layer. Preferably, the barrier layer will prevent migration of the liner ions into the junction and channel regions of the transistors during subsequent processing steps. Such migration could deleteriously affect transistor function by, e.g., increasing the threshold voltage and thus decreasing the drive current. The barrier layer may include nitrogen-containing species. In an embodiment, the barrier layer implant may include nitrogen ions implanted at a concentration of between about $5\times10$ cm$^{-2}$ and about $6\times10^{15}$ cm$^{-2}$ and an energy of between about 200 keV and 1000 keV.

In an alternative embodiment, the barrier layer may be formed by growing an epitaxial layer of single crystal silicon upon the upper surface of the semiconductor substrate with simultaneous incorporation of nitrogen within the epitaxial layer during growth. According to this embodiment, the sacrificial layer is optional; however, if a sacrificial layer is included, the sacrificial layer is formed after the barrier layer rather than before, as in the previously described embodiment.

After the barrier layer is formed, channel implants, well implants, and threshold voltage adjust implants may be performed. Preferably, the implants having the heaviest dopant concentration are performed first. Alternatively, the implants may be performed in any order. The sacrificial layer, if employed, may then be removed using an etch technique selective for the sacrificial material. Either a wet etch or a dry (plasma) etch may be used. If the sacrificial layer and the isolation structures include the same material, a portion of the isolation structures will be simultaneously removed with the sacrificial layers. Due to the much greater thickness of the isolation structures, however, removing a portion of the isolation structures is not anticipated to adversely affect device performance.

A gate dielectric layer may then be formed upon the surface of the semiconductor substrate. In an embodiment, the gate dielectric layer may include thermally grown silicon dioxide. Alternatively, the gate dielectric material may include silicon dioxide deposited from, e.g., a silane- and oxygen-bearing source. The gate dielectric is preferably formed to a thickness of between about 20 and 40 angstroms. A conductive gate layer may be formed upon the gate dielectric material. The conductive gate material may include polycrystalline silicon ("polysilicon") formed by, e.g., chemical-vapor deposition. In an embodiment, nitrogen may be implanted into the conductive gate material to a level proximate the interface with the gate dielectric material to prevent migration of dopants from the gate conductor through the gate dielectric to the substrate. A photoresist may be deposited upon the conductive gate material and selectively patterned as is well known in the art. A directional plasma etch, or other suitable etch, may then be used to remove portions of the conductive gate material and the gate dielectric layer to form a gate conductor spaced above the semiconductor substrate by a gate dielectric.

Following patterning of the conductive gate, lightly doped drain impurity areas may be formed adjacent the gate by implanting ions of a conductivity type opposite the conductivity type of the liner implant into the semiconductor substrate to a depth less than the depth of the liner layer. A suitable energy is between 2.0 to 3.0 keV, and a suitable concentration is about $1.0\times10^{15}$ cm$^{-2}$ to $7.0\times10^{15}$ cm$^{-2}$. A dielectric material may then be deposited across the semiconductor topography and selectively removed to form spacers adjacent sidewalls of the gate conductor. Source and drain impurity areas may then be formed by implanting ions of the same conductivity type as the LDD implants into the substrate at a concentration and an energy greater than the concentration and energy used for the LDD implant. Following source/drain impurity area formation, metal silicide may be formed upon the source and drain areas and the gate conductor.

BRIEF DESCRIPTION OF THE DRAWINGS

Other objects and advantages of the invention will become apparent upon reading the following detailed description and upon reference to the accompanying drawings in which.

Figure 1:
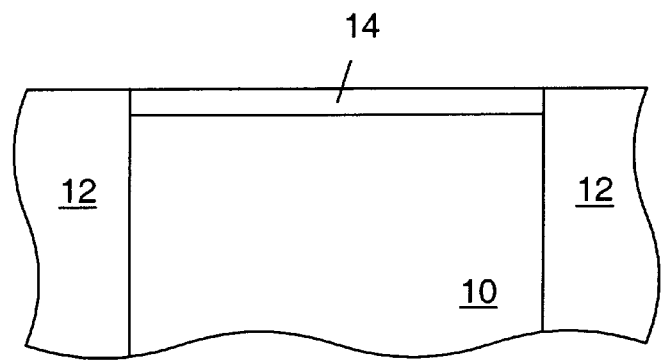
FIG. 1 depicts a partial cross-sectional view of a semiconductor topography according to an embodiment of the present invention, wherein isolation structures and a sacrificial layer have been formed in a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, isolation regions 12 have been formed in a semiconductor substrate 10, as depicted in FIG. 1. Semiconductor substrate 10 may be a single crystalline silicon substrate lightly doped with p-type or n-type dopant species. Isolation regions 12 may be formed using, e.g., the well-known shallow trench isolation ("STI") or local oxidation of silicon ("LOCOS") technique. Following formation of isolation regions 12, sacrificial layer 14 may be formed upon an upper surface of semiconductor substrate 10 between the isolation regions In an embodiment, sacrificial layer 14 may include silicon dioxide grown upon silicon substrate 10. Preferably, sacrificial layer 14 has a thickness between about 20 angstroms and about 100 angstroms. Sacrificial layer 14 may be grown using, e.g., dry oxidation at a temperature between about 780–900° C. and a pressure of about 1 atm for approximately 30 minutes. Alternatively, sacrificial layer 14 may be grown at a temperature of between about 900–1000° C. and a pressure of between about 0.25–2 torr. Alternatively, sacrificial layer 14 may be grown using a high-pressure, low-temperature process (e.g., 10 atm and 750° C.). In a further alternative, rapid thermal processing may be used to grow sacrificial layer 14 to a preferred thickness of about 100 to 300 angstroms.

Figure 2:
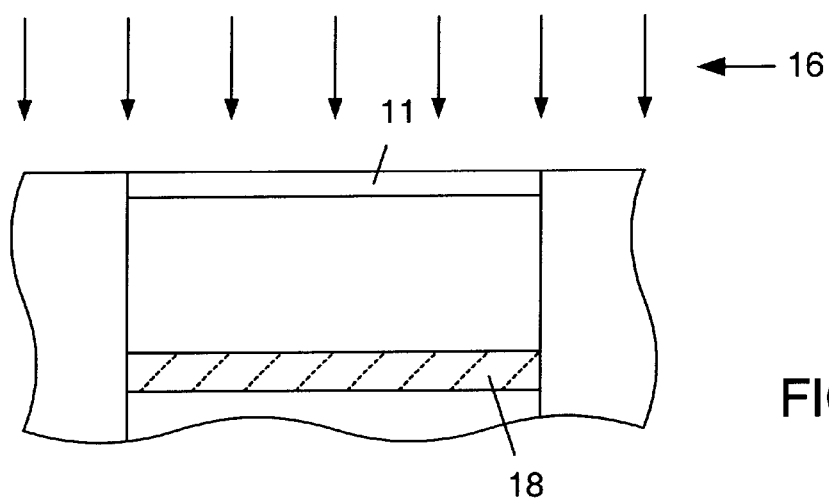
FIG. 2 depicts a partial cross-sectional view of the semiconductor topography wherein a liner layer has been formed in an active region of the semiconductor substrate.

Turning now to FIG. 2, liner layer 18 is formed in semiconductor substrate 10. Liner layer 18 may be formed in the active region of semiconductor substrate 10 by implanting a high concentration of dopant ions 16 into the substrate. Preferably, the implant energy is sufficient to implant liner layer 18 to a depth below the channel region of the substrate and below which lightly doped drain and source/drain impurity areas may subsequently be formed (see FIG. 10). Preferably, liner implant 16 is of a conductivity type opposite the conductivity type of the device to be formed. For example, in an NMOS embodiment, the liner implant ions may include p-type species, and in a PMOS embodiment, the liner implant ions may include n-type species.

Using an NMOS device as an example, boron ions may be implanted into semiconductor substrate 10 at an energy between about 100 keV and about 500 keV and a concentration between about $5\times10^{15}$ cm$^{-2}$ and about $8\times10^{15}$ cm$^{-2}$. The resulting liner layer 18 is preferably formed at a depth of between about 300 angstroms and about 2000 angstroms beneath the upper surface 11 of the semiconductor substrate 10. Alternatively, other sources for p-type ions, such as boron difluoride, may be used to form liner layer 18.

Figure 3:
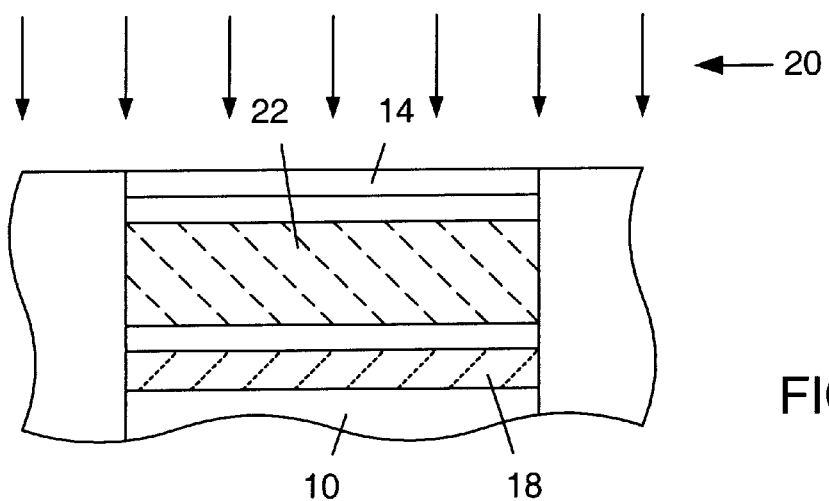
FIG. 3 depicts a partial cross-sectional view of the semiconductor topography wherein a barrier layer has been formed in the active region of the semiconductor substrate.

Barrier layer 22 may then be formed within semiconductor substrate 10. Barrier ions 20 may be implanted into semiconductor substrate 10 at a depth less than the depth of liner layer 18 and greater than a depth of sacrificial layer 14, as shown in FIG. 3. Preferably, barrier layer 22 acts as a dopant seal and will prevent migration of the liner layer 18 into the junction and channel regions of the transistors both during subsequent processing steps and while the transistor is in use. Such migration could deleteriously affect transistor function by, e.g., increasing the threshold voltage and thus decreasing the drive current. Barrier layer 22 may include nitrogen-containing species. In an embodiment, the barrier layer implant may include nitrogen ions implanted at a concentration of between about $5\times10^{15}$ cm$^{-2}$ and about $6\times10^{15}$ cm$^{-2}$ and an energy of between about 200 keV and 1000 keV.

Figure 4A:
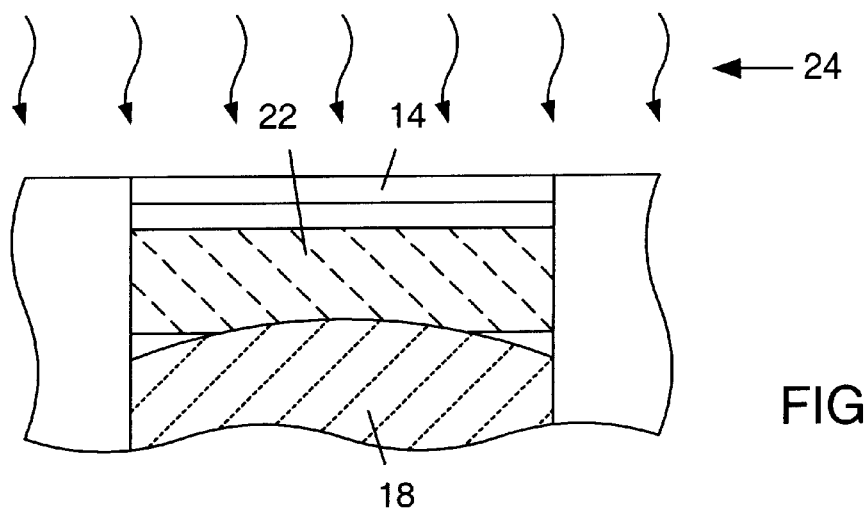
FIG. 4A depicts a partial cross-sectional view of the semiconductor topography wherein the barrier layer has been annealed.

Radiation 24 may be used to anneal barrier layer 22, as shown in FIG. 4A. Annealing preferably occurs in a rapid thermal processing chamber at temperatures between 700° and 950° C. for 5–60 seconds. Annealing may also occur in a tube furnace for 5–30 minutes at a temperature of 650°–850° C. The ambient in which the topography is placed is preferably an inert ambient, which may contain helium, argon, and/or nitrogen. Radiation 24 may causes diffusion of barrier species such that barrier layer 22 extends from a depth slightly greater than the depth of sacrificial layer 14 to an upper extent of liner layer 18.

Figure 4B:
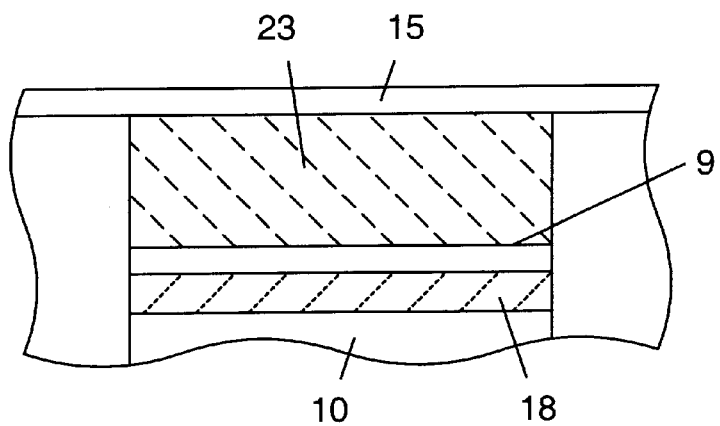
FIG. 4B depicts a partial cross-sectional view of the semiconductor topography according to an alternative embodiment wherein a nitrogen-incorporated epitaxial layer of silicon is grown upon the substrate upper surface.

In an alternative embodiment shown in FIG. 4B, a layer of silicon may be epitaxially grown upon upper surface 9 of semiconductor substrate 10 in the presence of nitrogen to form a barrier layer 23 following formation of liner layer 18. The barrier layer then preferably includes single crystal silicon having a graded nitrogen profile incorporated therein. According to the alternative embodiment, an optional sacrificial layer 15 may be formed after the barrier layer, rather than before as previously described.

Figure 5:
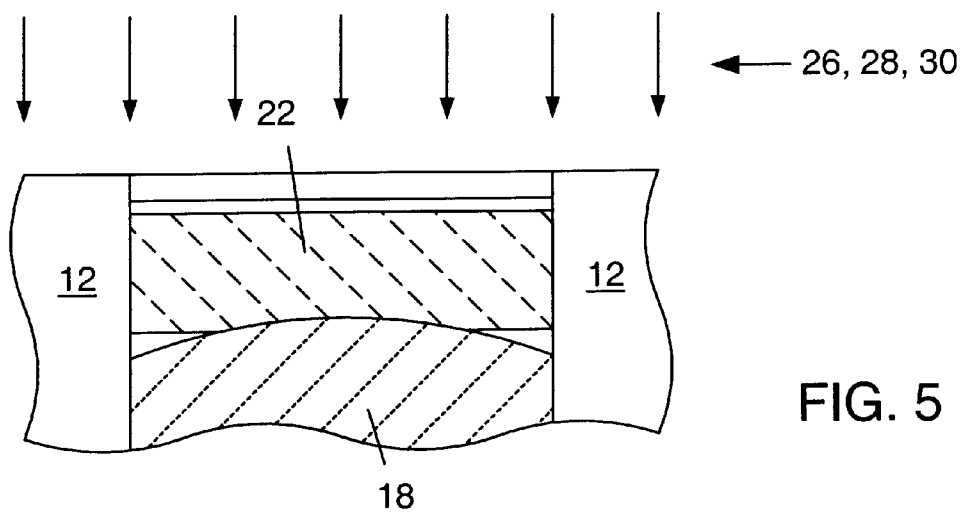
FIG. 5 depicts a partial cross-sectional view of the semiconductor topography wherein channel stop, well, and threshold voltage adjust implants have been performed.

Turning now to FIG. 5, channel stop implant 26, well implant 28, and threshold voltage ($V_T$) adjust implant 30 may be forwarded into semiconductor substrate 10. Channel stop implant 26 may be performed to increase doping under isolation regions 12 to improve isolation of adjacent transistors from one another. Channel stop implant 26 includes p-type species (such as boron) when the device being fabricated is an NMOS and n-type species (such as arsenic) when the device is a PMOS. For example, in an NMOS embodiment, channel stop implant 26 may include boron ions implanted into semiconductor substrate 10 at a concentration of between about $10^{12}$ cm$^{-2}$ and about $10^{13}$ cm$^{-2}$ and an energy between about 40 keV and 80 keV.

Well implant 28 may be performed to allow fabrication of both NMOS and PMOS transistors on the same substrate. Well implant 28 is of the same conductivity type as channel stop implant 26. For example, if channel stop implant 26 includes boron, well implant 28 may also include boron implanted at a concentration of between about $2\times10^{12}$ cm$^{-2}$ and about $8\times10^{12}$ cm$^{-2}$ and an energy between about 100 keV and about 200 keV. The well implant may be followed by a drive-in at a temperature of, e.g., about 1100° C. and a duration of about 500 minutes.

Threshold voltage adjust implant 30 may be performed to allow doping of the substrate without having to consider the effect of the substrate doping on the $V_T$ of the device. A p-type implant is used to effect a positive shift in $V_T$, while an n-type implant is used to effect a negative shift in $V_T$. The concentration and energy of the $V_T$ adjust implant 30 are preferably selected such that the ions have sufficient energy to penetrate sacrificial layer 14 but not isolation regions 12. As an example, $V_T$ adjust ions may be implanted at a concentration of between about $10^{12}$ cm and about $10^{13}$ cm$^{-2}$ and an energy of about 50 keV to about 100 keV. The exact concentration and energy will be selected depending upon the depth to which the ions will be implanted and the amount of $V_T$ adjustment required. In an embodiment, the energy and concentration of $V_T$ implant 30 may be selected such that the ions reside at a desired depth within substrate 10 following removal of sacrificial layer 14 and subsequent formation of a gate dielectric layer upon the semiconductor substrate (see FIG. 6).

As described herein, channel stop implant 26, well implant 28, and $V_T$ adjust implant 30 may be performed following formation of liner layer 18 and barrier layer 22. In an alternative embodiment, at least one of implants 26, 28, and 30 may be performed prior to formation of liner layer 18 and barrier layer 22. In yet another embodiment, at least one of implants 26, 28, and 30 may be performed prior to formation of isolation regions 12. In addition, although implants 26, 28, and 30 are typically performed in order from deepest to shallowest, the order of implants may be varied. As such, the implants 26, 28, and 30 may be performed in any order and need not be performed at the same point in the processing sequence. Due to the high diffusivity of boron ions that may be used for liner implant 16, however, annealing of the substrate should be performed only after formation of barrier layer 22 to prevent migration of liner layer 18 into the junction region of semiconductor substrate 10.

Figure 6:
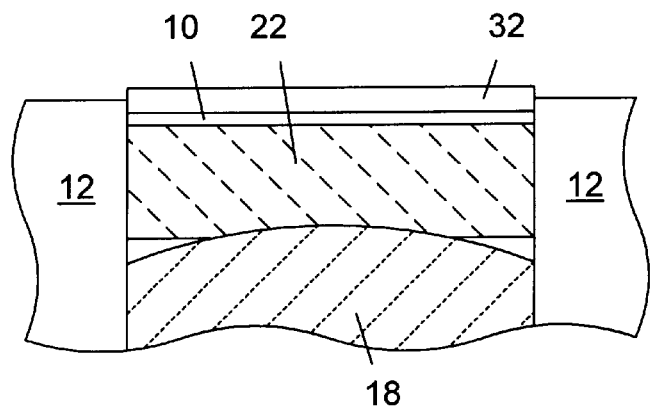
FIG. 6 depicts a partial cross-sectional view of the semiconductor topography wherein the sacrificial layer has been removed and a gate dielectric layer formed upon the semiconductor substrate.

As shown in FIG. 6, sacrificial layer 14 may be removed from semiconductor substrate 10. Sacrificial layer 14 may be removed using, e.g., an anisotropic plasma (dry) etch selective for the sacrificial layer. Alternatively, sacrificial layer 14 may be removed using a wet or dry isotropic etch highly selective for the sacrificial layer. In an embodiment in which sacrificial layer 14 includes silicon dioxide, portions of isolation structures 12 may be removed along with sacrificial layer 14. Because the isolation structures are significantly thicker than the sacrificial layer (e.g., 3000–4000 angstroms versus less than 300 angstroms), isolation of subsequently formed transistors should not be adversely affected by removal of a portion of the isolation structures.

Following removal of sacrificial layer 14, gate dielectric 32 may be formed upon the new upper surface of semiconductor substrate 10. Preferably, gate dielectric 32 includes thermally grown silicon dioxide formed by exposing semiconductor substrate 10 to thermal radiation 30 in an oxidizing ambient. Growth conditions for gate dielectric layer 32 may be similar to conditions used to form sacrificial layer 14. Alternatively, gate dielectric 32 may be formed by deposition of a dielectric material upon semiconductor substrate 10 and isolation regions 12, followed by selective removal of the dielectric material from upon the isolation regions.

Figure 7:
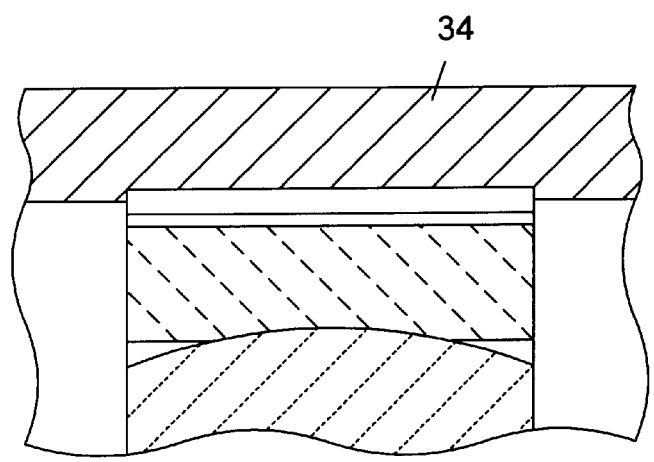
FIG. 7 depicts a partial cross-sectional view of the semiconductor topography wherein a conductive gate layer has been formed upon the semiconductor topography.
Figure 8:
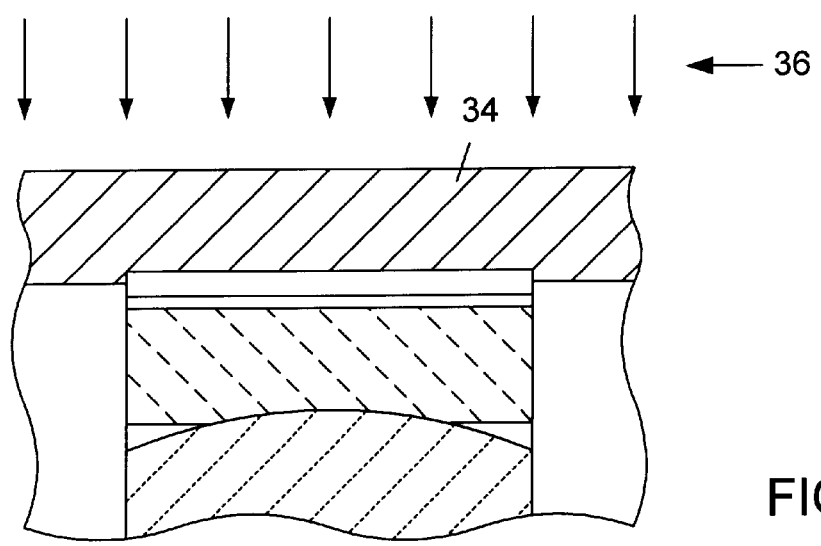
FIG. 8 depicts a partial cross-sectional view of the semiconductor topography wherein nitrogen has been introduced into the conductive gate layer.

Following formation of gate dielectric 32, a layer conductive gate material 34 may be deposited across the semiconductor topography, as shown in FIG. 7. Conductive gate material 34 may include polycrystalline silicon rendered conductive by implantation of n-type or p-type ions (not shown). In an embodiment, nitrogen 36 may be introduced into conductive gate material 34 by, e.g., ion implantation, as shown in FIG. 8. Nitrogen 36 may be used to prevent migration of dopant ions from the subsequently formed gate conductor (see FIG. 9) into the channel region beneath the gate. In an alternative embodiment, conductive gate material 34 may be doped with n-type or p-type dopants following introduction of nitrogen 36.

Figure 9:
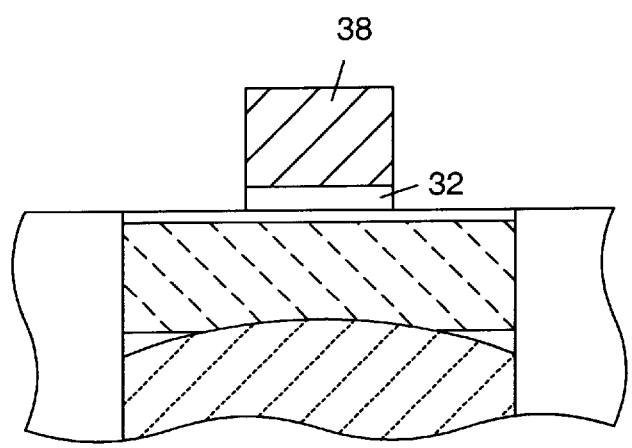
FIG. 9 depicts a partial cross-sectional view of the semiconductor topography wherein the conductive gate layer has been patterned to form a gate conductor.
Figure 10:
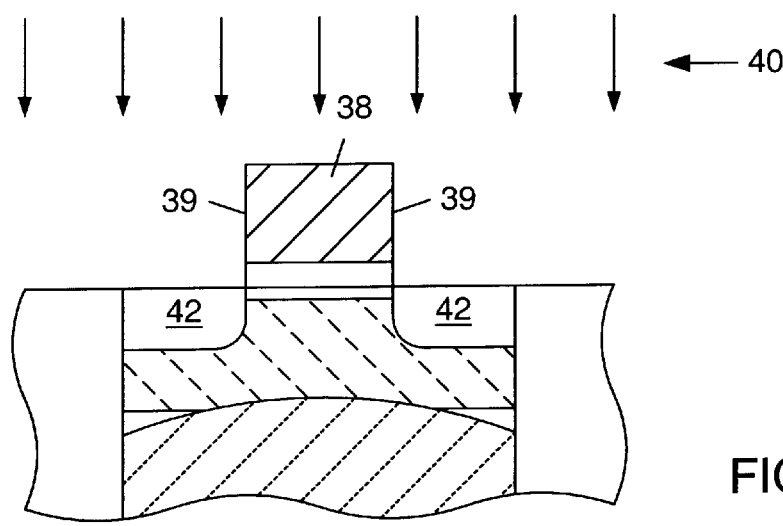
FIG. 10 depicts a partial cross-sectional view of the semiconductor topography wherein lightly doped drain impurity areas have been formed within the semiconductor substrate self-aligned with the gate conductor.

Turning now to FIG. 9, conductive gate material 34 may be patterned using, e.g., photolithography patterning and etch techniques that are well known in the art, to form gate conductor 38. As depicted in FIG. 9, portions of gate dielectric 32 not underlying gate conductor 38 may be removed at this time as well. Alternatively, those portions of gate dielectric 32 not underlying gate conductor 38 may be removed during subsequent processing but before formation of a metal silicide layer upon the semiconductor substrate (see FIG. 13). Lightly doped drain (LDD) regions 42 may then be formed in semiconductor substrate 10 self-aligned to sidewall surfaces 39 of gate conductor 38, as shown in FIG. 10. LDD regions 42 may be formed by implanting dopant ions 40 into semiconductor substrate 10. As shown in FIG. 10, LDD regions 42 may extend into barrier layer 22.

Figure 11:
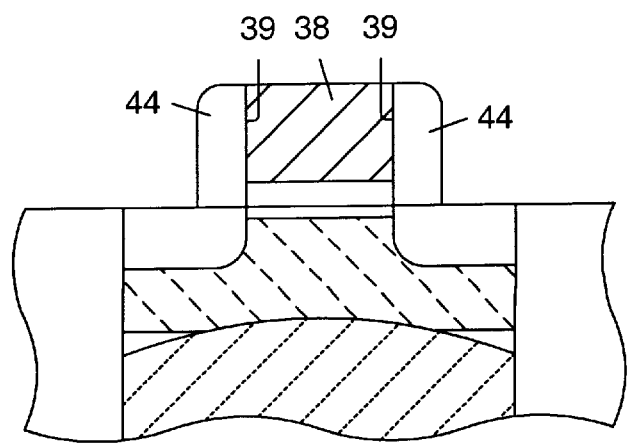
FIG. 11 depicts a partial cross-sectional view of the semiconductor topography wherein spacers have been formed adjacent opposed sidewall surfaces of the gate conductor.
Figure 12:
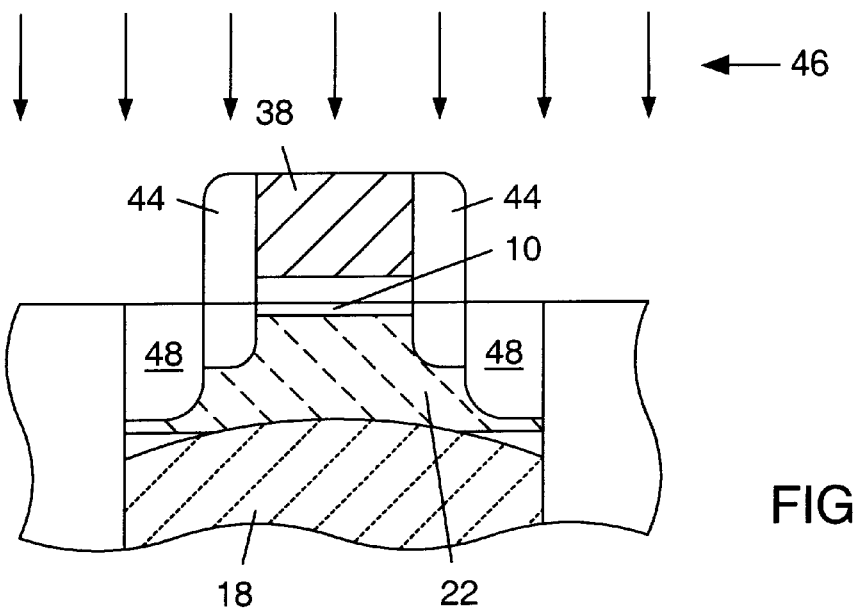
FIG. 12 depicts a partial cross-sectional view of the semiconductor topography wherein source and drain impurity areas have been formed self-aligned with sidewall surfaces of the spacers.

Spacers 44, shown in FIG. 11, may be formed adjacent sidewall surfaces 39 of gate conductor 38 by deposition and selective removal of a dielectric material, as is well known in the art. Following the spacer formation, impurity distribution 46 may be forwarded into portions of semiconductor substrate 10 not masked by gate conductor 38 and spacers 44, as shown in FIG. 12. Heavily doped source and drain impurity areas 48 may be formed in semiconductor substrate 10 self-aligned with sidewall surfaces of spacers 44. In an embodiment, impurity distribution 46 includes dopant ions forwarded into semiconductor substrate 10 using ion implantation. As shown in FIG. 12, source and drain regions 48 may extend into barrier layer 22. Preferably, impurity distribution 46 is implanted at a greater concentration and energy than lightly doped drain impurity distribution 36.

Source and drain regions 48 are preferably formed above liner layer 18 such that source and drain regions 48 do not undergo migration into the liner layer. Further, the presence of barrier layer 22 preferably facilitates formation of shallow junctions in the semiconductor substrate. In addition, although FIGS. 10–12 depict formation of lightly doped drain areas 42 prior to formation of source and drain impurity areas 48, the source and drain areas could be fabricated self-aligned with spacers formed adjacent sidewall surfaces of the gate conductor, followed by removal of the spacers and subsequent formation of the lightly doped drain areas.

Figure 13:
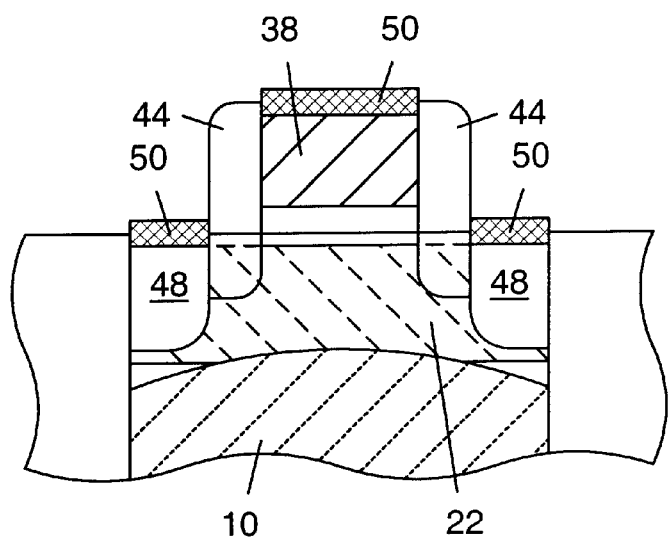
FIG. 13 depicts a partial cross-sectional view of the semiconductor topography wherein metal silicide has been formed upon exposed upper surfaces of the gate conductor and the source and drain regions.

FIG. 13 illustrates the formation of silicide structures (e.g., $TiSi_2$ or $CoSi_2$) upon the upper surfaces of gate conductor 38 and source and drain regions 48. A refractory metal such as titanium or cobalt may be deposited across the semiconductor topography using, e.g., sputter deposition from a metal target or metal oxide CVD deposition from a gas including a metal organic-containing compound. Sidewall spacers 44 are strategically placed laterally adjacent the sidewall surfaces of gate conductor 38 to inhibit refractory metal from contacting the gate conductor. The metal is then exposed to a form of radiation supplied from, e.g., an annealing furnace or an RTA chamber under elevated temperatures of about 700° C. for 30 seconds.

As a result of being subjected to a heat cycle, the metal reacts with underlying silicon of substrate 10 and polysilicon gate conductor 38 to form metal silicide structures 50 upon upper surfaces of the gate conductor and the source and drain regions. Unreacted portions of the refractory metal are then removed using an etch technique which is highly selective to the unreacted metal.

It will be appreciated to those skilled in the art having the benefit of this disclosure that the process described herein is believed to provide a method for forming a transistor having increased resistance to punchthrough and decreased capacitance. The barrier layer described herein is believed to promote increased punchthrough resistance by allowing fabrication of a transistor having a highly doped punchthrough stop layer. In addition, the barrier layer is believed to facilitate formation of a transistor having shallow junctions. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit comprising:

an ion-doped liner layer spaced a first depth below an upper surface of a semiconductor substrate;

an inert ion-doped barrier layer spaced a second depth below the upper surface of the semiconductor substrate, wherein the second depth is less than the first depth, and wherein at least a portion of said barrier layer is spaced above said liner layer; and a gate structure configured upon the upper surface of the semiconductor substrate, wherein the gate structure comprises a gate conductor spaced above the semiconductor substrate by a gate dielectric.

2. The integrated circuit as recited in claim 1 wherein the ion-doped liner layer comprises boron.

3. The integrated circuit as recited in claim 1 wherein the first depth is between about 0.03 $\mu$m and about 0.2 $\mu$m.

4. The integrated circuit as recited in claim 1 wherein the inert ion-doped barrier layer comprises nitrogen.

5. The integrated circuit as recited in claim 1 wherein the second depth is between about 20 angstroms and about 100 angstroms.

6. The integrated circuit as recited in claim 1 further comprising:

sidewall spacers laterally adjacent sidewall surfaces of the gate conductor;

lightly doped drain impurity areas aligned said sidewall surfaces of said gate conductor; and source and drain impurity areas aligned with sidewall surfaces of the spacers.

7. The integrated circuit as recited in claim 1 wherein the gate dielectric comprises a material selected from the group consisting of thermally grown silicon dioxide and deposited silicon dioxide.

8. The integrated circuit as recited in claim 1 wherein the gate conductor comprises polycrystalline silicon.

9. The integrated circuit as recited in claim 1 wherein the gate conductor comprises barrier atoms above said gate dielectric.

10. The integrated circuit as recited in claim 9 wherein the barrier atoms include nitrogen.

11. The integrated circuit as recited in claim 6 further comprising a metal silicide formed upon the gate conductor and the source and drain impurity areas.

12. An integrated circuit topography comprising:

source and drain impurity areas within a semiconductor substrate;

a channel region within said semiconductor substrate between said source and drain impurity areas;

an ion-doped liner layer spaced a first depth below an upper surface of a semiconductor substrate, wherein an upper surface of said liner layer is below said channel region; and an ion-doped barrier layer spaced a second depth below the upper surface of the semiconductor substrate, wherein the second depth is less than the first depth and wherein at least a portion of said barrier layer is spaced above said liner layer.

13. The integrated circuit as recited in claim 12 herein the ion-doped liner layer comprises boron.

14. The integrated circuit topography as recited in claim 12 wherein the first depth is between about 0.03 $\mu$m and about 0.2 $\mu$m.

15. The integrated circuit as recited in claim 12 wherein the ion-doped barrier layer comprises nitrogen.

16. The integrated circuit as recited in claim 12 wherein the second depth is between about 20 angstroms and about 100 angstroms.

* * * * *